(12) United States Patent
Rheiter et al.

(10) Patent No.: US 9,593,403 B2
(45) Date of Patent: Mar. 14, 2017

(54) METHOD FOR EJECTING MOLTEN METALS

(71) Applicant: OCE-TECHNOLOGIES B.V., Venlo (NL)

(72) Inventors: Hendrikus J. H. Rheiter, Venlo (NL); Mircea V. Rasa, Venlo (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 14/680,782

(22) Filed: Apr. 7, 2015

(65) Prior Publication Data
US 2015/0299839 A1    Oct. 22, 2015

(30) Foreign Application Priority Data

Apr. 16, 2014    (EP) .................................... 14164956

(51) Int. Cl.
| | |
|---|---|
| *C23C 4/12* | (2016.01) |
| *B41J 2/06* | (2006.01) |
| *C23C 4/08* | (2016.01) |
| *H05K 3/14* | (2006.01) |

(52) U.S. Cl.
CPC ................ *C23C 4/121* (2013.01); *B41J 2/06* (2013.01); *C23C 4/01* (2016.01); *C23C 4/08* (2013.01); *C23C 4/123* (2016.01); *H05K 3/14* (2013.01); *B41J 2202/04* (2013.01); *H05K 2203/0703* (2013.01); *H05K 2203/104* (2013.01)

(58) Field of Classification Search
CPC .. C23C 4/00; C23C 4/123; C23C 4/01; C23C 4/12; C22C 9/02

USPC ................. 164/46, 258; 266/202; 118/623; 222/593, 592, 594

See application file for complete search history.

(56) References Cited

U.S. PATENT DOCUMENTS

| | | | |
|---|---|---|---|
| 5,656,339 A | 8/1997 | Wesseling et al. | |
| 2006/0183270 A1 | 8/2006 | Humpston | |
| 2011/0233239 A1* | 9/2011 | Rasa ........................ | B22F 9/082 222/591 |
| 2014/0099788 A1* | 4/2014 | Rasa ........................ | C23C 4/08 438/669 |

FOREIGN PATENT DOCUMENTS

| | | | |
|---|---|---|---|
| KR | 2009/0067424 | * | 6/2016 |
| WO | WO 2012/168158 A1 | | 12/2012 |

OTHER PUBLICATIONS https://www.google.com/search?q=au-si+phase+diagram
&biw=1470&bih=797&tbm=isch
&imgil=glyLXkv04bWjQM%253A%253B7wQK_
7IFcJwmYM%253Bhttp%25253A%25252%25252Fresource.npl.
co.uk%25252Fmtdata%25252Fphdiagrams%25252Fausi.htm
&source=iu&pf=m
&fir=glyLXkv04bWjQM%253A%252C7wQK_
7IFcJwmYM%252C_&usg=__5vt034w__VeN31hlbRtRm-
4VTGx0%3D&ved=0ahUKEwjpmeb7rJnK.*

* cited by examiner

*Primary Examiner* — Tabassom Tadayyon Eslami
(74) *Attorney, Agent, or Firm* — Birch, Stewart, Kolasch & Birch, LLP

(57) ABSTRACT

In a method for ejecting droplets of a molten metal, the metal is an alloy including a first metal and a second metal. During a jetting operation, the second metal segregates from the first metal. A method of using such alloy is also disclosed herein.

10 Claims, 2 Drawing Sheets

METHOD FOR EJECTING MOLTEN METALS

CROSS-REFERENCE TO RELATED APPLICATIONS

This application claims priority under 35 U.S.C. §119(a) to Application No. 14164956.6, filed in Europe on Apr. 16, 2014, the entire contents of which is hereby incorporated by reference into the present application.

BACKGROUND OF THE INVENTION

1. Field of the Invention

The present invention relates to a method for jetting molten metals. The present invention further relates to the use of an alloy comprising a first metal and a second metal for ejecting droplets of a molten metal.

2. Description of Background Art

A jetting device for ejecting droplets of a molten metal is known. An example of a jetting device for ejecting droplets of a molten metal is described in WO 2010/063576 A1. In such a printing device, a Lorentz force is generated in the molten metal due to which a droplet is expelled through an orifice of the printing device. Such a device may be used to eject droplets of a molten metal at a high temperature. Hence, using such device, metals having a high melting point, such as silver, gold and copper can be jetted.

Direct printing of molten metals may be employed for printing electronic circuitry, for example. In such an application, it is essential that all droplets are actually printed accurately as otherwise the electronic circuitry may not function due to an interruption in the electronic connections as a result of a missing droplet, for example. Ejection of a droplet may be hampered in case an orifice is blocked. An orifice that is blocked contains solid material that is deposited in and/or around the orifice. The solid material may comprise, e.g. contaminants present in the metal.

When an orifice is blocked, it may be more difficult or even impossible to eject a droplet of fluid from the orifice. As a consequence, a decrease in the jetting stability may therefore result in missing droplets. It is therefore desirable to prevent the orifice from becoming blocked.

SUMMARY OF THE INVENTION

Therefore, it is an object of the invention to provide a method that prevents blocking of the orifice.

It has been found that blocking of the orifice can be prevented or at least delayed by applying a method for ejecting droplets of a molten metal, the molten metal being positioned in a fluid chamber body, the fluid chamber body forming a fluid chamber for holding an amount of the molten metal, the fluid chamber body comprising an orifice, the orifice being in communication with the fluid chamber, wherein the method comprises the steps of:

providing a magnetic field to at least part of the molten metal positioned in the fluid chamber;

providing an electrical current in the part of the molten metal positioned in the magnetic field, thereby generating a Lorentz force in the molten metal;

wherein the molten metal is a molten alloy comprising a first molten metal and a second molten metal, wherein the first molten metal and the second molten metal are selected such that in operation, the second metal metal segregates from the first molten metal.

In a known system for printing a molten metal, a droplet of said metal is expelled through an orifice by a Lorentz force. This force causes a motion in the metal. This motion may cause a part of the molten metal to move from the fluid chamber through the orifice, thereby generating a droplet of the molten metal. The Lorentz force is related to the electric current and the magnetic field vector; $\vec{F}=\vec{I}\times\vec{B}$. The Lorentz force resulting from the electric current and the magnetic field is generated in a direction perpendicular to both the electrical current and the magnetic field. By suitably selecting the direction and the magnitude of the electric current, as well as the direction and the magnitude of the magnetic field, the direction and the magnitude of the resulting Lorentz force may be selected. In the system according to the present invention, in normal operation, the magnetic field is provided and an electrical current is provided in the molten metal, such that a suitable force for ejecting a droplet is generated.

The jetting device in accordance with the present invention comprises a fluid chamber and has an orifice extending from the fluid chamber to an outer surface of the fluid chamber element. In operation, the fluid chamber comprises a molten metal therein.

When applying an actuation pulse, a Lorentz force is generated within the metal, causing the molten metal to move through the orifice in a direction away from the fluid chamber. The actuation pulse may be applied by applying a pulsed magnetic field and a continuous electrical current, or a pulsed electrical current in a continuous magnetic field, or a combination thereof. Alternatively, a constant Lorentz force may be generated within the metal by applying a constant electrical current to the electrically conductive fluid in a constant magnetic field. However, application of a constant Lorentz force to the molten metal may result in the ejection of a stream of the electrically conductive fluid, instead of in the ejection of droplets.

The jetting device may be positioned in an inert atmosphere, for example an inert gas such as nitrogen or a noble gas. By using an inert atmosphere, oxidation of the metal by reacting with oxygen from the air may be prevented and hence, the rate of oxidation of the metal may be decreased. However, it was found that, even if an inert atmosphere is applied, oxidation of the metal and of impurities in the metal may still occur.

To prevent problems relating to precipitation of contaminants present in the system, or precipitation of oxides of the metal or impurities present in the system, an alloy is used. The alloy may comprise at least two metals. The first metal may be the principle metal; i.e. the metal to be applied onto a recording medium. The second metal may be a metal different from the first metal. The first metal and the second metal may be selected such that the second metal segregates from the first metal during a jetting operation at an operation temperature of the molten alloy. The segregation of the second metal from the first metal during a jetting operation may be the result of differences in properties of the first and second metal, respectively. For example, segregation may be the result of a difference in surface tension or atomic radius. The second metal and the first metal may be made from an alloy. The first metal, the second metal and the alloy may be in a molten state at an operation temperature of a jetting device.

In operation, at least a part of the alloy may be positioned in a fluid chamber. At an inner surface of the fluid chamber, there may be an interface between the alloy present in the fluid chamber and the fluid chamber body. When, in operation, the second metal segregates from the first metal, phase separation may take place in the molten alloy. A first phase may be formed which is rich in the first metal and poor in the second metal and a second phase may be formed which is rich in the second metal and poor in the first metal. At least a part of the second metal may migrate to the interface between the alloy and the fluid chamber body, thereby forming the second phase. The second phase may form a thin layer in between the first phase and the inner surface of the fluid chamber. Thus, the inner surface of the fluid chamber may, in operation, be selectively covered by the second phase, which is rich in the second metal.

Without wanting to be bound to any theory, it is believed that the selective coverage of the inner surface of the fluid chamber with the second phase may prevent precipitation and clogging of the inner surface of the fluid chamber, including the nozzle. Contaminants present in the alloy may stay in the first phase. Because the first phase may be separated from the fluid chamber body by the second phase, the contaminants may not precipitate against a surface of the fluid chamber body and hence clogging may be prevented.

In an embodiment, the surface tension of the second metal is smaller than the surface tension of the first metal.

When an alloy comprising two metals, wherein the surface tension of the two metals are not the same, is in the molten state, then the metal having the smallest surface tension may segregate from the alloy. In this embodiment, the surface tension of the second metal may be lower than the surface tension of the first metal. The difference in surface tension between the first metal and the second metal may provide a suitable driving force for segregation of the second metal from the alloy comprising the first metal and the second metal. Hence, in operation the molten metal alloy in the fluid chamber may, at the interface between the molten alloy and the inner surface of the fluid chamber body, have a relatively high amount of the second molten metal. Away from the interface, the amount of the second molten metal in the molten alloy may be relatively low.

The surface tension of the second metal may be 15% lower than the surface tension of the first metal, preferably 30% lower than the surface tension of the first metal, more preferably at least 50% lower than the surface tension of the first metal.

In an embodiment, the temperature of the molten metal in the fluid chamber is at least 500° C. Metals generally have a high melting point. In order to eject droplets of a molten metal using Lorentz actuation, the metal may need to be in a fluid phase. Generally, metals have a high melting point. For example, the melting point of silver is 972° C., the melting point of copper is 1085° C., the melting point of tin is 231° C. and the melting point of gold is 1064° C. Hence, in order to suitably eject droplets of a molten fluid, the temperature of the molten metal in the fluid chamber may be such that the metal to be jetted is in a molten state. The temperature of the molten metal in the fluid chamber is preferably at least 500° C., more preferably at least 700° C., even more preferably at least 900° C., for example at least 1100° C.

In an embodiment, the first molten metal is selected from the group consisting of copper, silver and gold. Metals are materials that in general have a good electric conductivity. For example, ejecting droplets of a molten metal may be used to print electronic circuits. By applying a printing technique to apply droplets of metal onto a recording medium, electronic circuits may be printed in a versatile way; i.e. the shape of the circuit may be easily adapted for the respective electronic circuits. Silver, gold and copper may be usefully applied in electronic devices, for example as electrodes. By applying an image of silver, copper or an alloy thereof onto a recording medium, electrically conductive parts, such as electrodes, may be efficiently applied onto the recording medium.

In a further embodiment, the first molten metal is copper. As mentioned above, copper may be usefully applied in a jetting process to manufacture electrically conductive parts. Use of copper is preferred, for example because of its lower cost compared to silver and gold.

In a further embodiment, the second molten metal is tin. Tin may be usefully applied as a second metal in accordance with the present invention, i.e.: tin may be usefully applied as a second metal that, in operation, segregates from the metal alloy comprising the first metal and the second metal.

Tin has a melting point of 231° C. Hence, tin may be in the fluid state in operation. Moreover, tin has a relatively low surface tension. For example, at 1200° C., the surface tension of tin is 0.46 N/m. Hence, the surface tension of tin is lower than the surface tension of copper, which is 1.3 N/m at 1200° C.

Hence, tin is suitable to be used as an additive for ejecting droplets of copper. In operation, in an ink chamber comprising an alloy comprising copper and tin, tin may selectively segregate from the copper alloy. Hence, at the interface between the metal alloy and the inner surface of the fluid chamber body, the metal alloy may be locally rich in tin. Tin has a low melting point and hence, the metal present at the interface may stay fluid in operation.

In addition, tin has a lower surface tension than Si and Al. Si and Al are materials that are often present in metals as impurities. Precipitation of these materials may block the orifice during a jetting operation. The surface tension of Si is 0.8 N/m at 1400° C., the surface tension of Al is 0.8 N/m at 1200° C. Hence, the surface tension of these contaminants is higher than the surface tension of tin. Hence, these contaminants may not compete with tin in segregating from the metal alloy and forming a second phase. Hence, the presence of tin in the metal alloy may efficiently prevent precipitation of Al and Si.

When jetting droplets of the fluid metal, the droplets may comprise the first metal. However, the droplets may also comprise a quantity of the second metal. A further advantage of using tin as an additive for copper is that the strength of the resulting alloy is increased compared to copper not comprising the tin additive. This is advantageous, for example when the object formed by ejection of the droplets of molten metal is a 3D-object. Small amounts of tin may suffice to achieve segregation of tin from the metal alloy during a jetting operation. However, larger amounts of tin may be added to the alloy. Depending on the amount of tin added to copper, the alloy may be bronze.

Other elements that may be efficiently used as a second metal are, e.g. Te, Se, Cd, In and Pb. These elements typically have a low surface tension.

In an embodiment, the first molten metal is present in an amount of 70 wt % or higher based on the total amount of molten metal. In the method according to the present invention, the alloy comprises a first metal and a second metal. The second metal may, in operation, segregate from the alloy. Hence, in operation, the bulk of the molten metal may be relatively rich in the first metal. The composition of the droplets may correspond to the composition of the bulk of the metal. Hence, the ejected droplets may be relatively rich in the first metal. Depending on the area of application, the purity of the metal to be jetted may be selected. For example, the alloy may comprise the first metal in an amount of 70 wt % or more based on the total amount of alloy. Preferably, the alloy may comprise the first metal in an amount of 80 wt % or more based on the total amount of alloy. For example, the alloy may comprise the first metal in an amount of from 85 wt %-99.99 wt % based on the total amount of alloy, such as from 88 wt %-99.7 wt % based on the total amount of alloy, for example, 90 wt %-97 wt % based on the total amount of alloy.

In an embodiment, the second molten metal is present in an amount of 10 wt % or less, based on the total amount of molten metal.

Depending on the area of application, the purity of the metal to be jetted may be selected. When a high purity metal is required, only a low amount of the second metal may be present in the alloy. On the other hand, a sufficient amount of the second metal may be necessary to suitably change the properties of the alloy at the interface between the inner surface of the fluid chamber and the alloy. For example, the alloy may comprise the second metal in an amount of 10 wt % or less based on the total amount of alloy. Preferably, the alloy may comprise the second metal in an amount of 7 wt % or less based on the total amount of alloy. For example, the alloy may comprise the second metal in an amount of from 5 wt %-0.10 wt % based on the total amount of alloy, such as from 3 wt %-0.5 wt % based on the total amount of alloy, for example, 2 wt %-1 wt % based on the total amount of alloy.

In an embodiment, the second metal has wetting properties with regard to the inner surface of the fluid chamber body. In operation, an amount of the alloy may be present in a fluid chamber. The fluid chamber may be formed by a fluid chamber body. At an inner surface of the fluid chamber body, there may be an interface between the alloy and the fluid chamber body. The inner surface of the fluid chamber body may comprise the same material as the fluid chamber. Alternatively, a coating may be applied on the inner surface of the fluid chamber body. The coating is preferably heat resistant. For example, the fluid chamber may be coated with a tungsten carbide, such as WC, $W_2C$ and $W_3C$. In operation, the second metal segregates from the alloy and hence, at the interface with the inner surface of the fluid chamber (e.g. the coating), a second phase may be formed, which is rich in the second metal. To allow a stable film of the second metal to be present at the interface, the inner surface of the fluid chamber may be wettable by the second metal.

In an aspect of the invention, use of an alloy for ejecting droplets of a molten metal is provided, wherein the alloy comprises a first metal and a second metal, wherein the surface tension of the second metal is smaller than the surface tension of the first metal.

As described above, such alloy can be suitably used in a process for ejecting droplets of a metal alloy. Use of such alloy may increase the stability of the jetting process.

In an embodiment, the alloy comprises a first metal and a second metal, wherein the first metal is copper and the second metal is tin. An alloy comprising copper and tin may be suitably used in a process for ejecting droplets of metal, wherein the droplets comprise copper. Use of this alloy may increase the stability of the jetting process.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
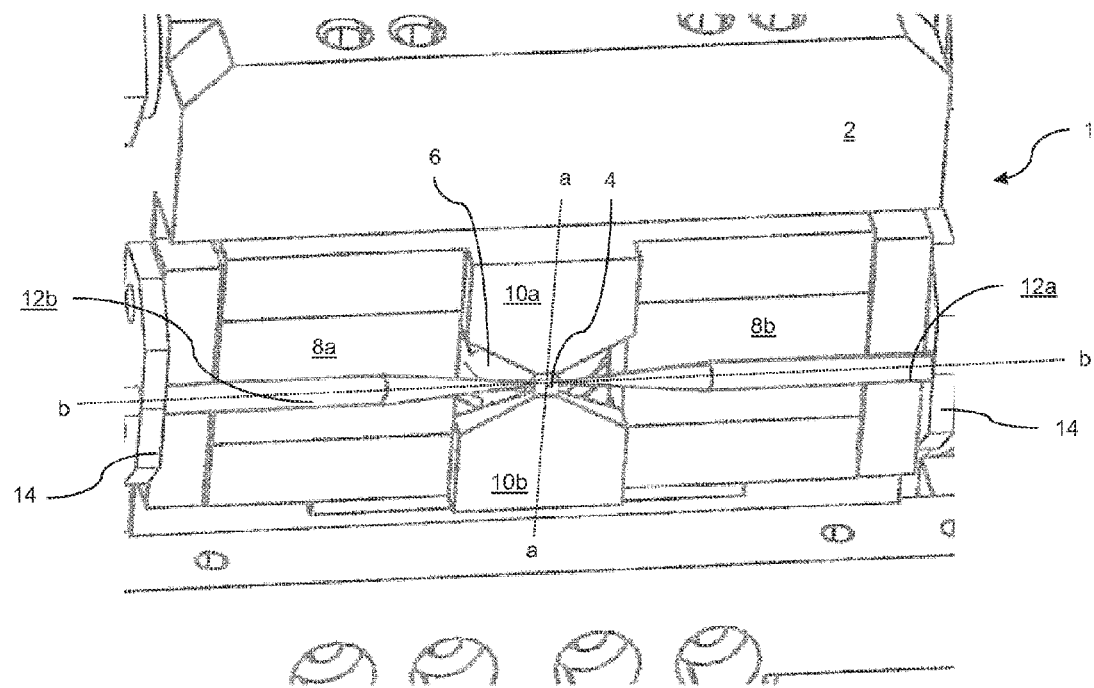
FIG. 1 is a perspective view of a printing device for printing droplets of an electrically conductive fluid.

The present invention will now be described with reference to the accompanying drawings, wherein the same reference numerals have been used to identify the same or similar elements throughout the several views.

FIG. 1 shows a part of a jetting device 1 for ejecting droplets of a relatively hot fluid, in particular a molten metal such as copper, silver, gold and the like. The jetting device 1 comprises a support frame 2, made of a heat resistant and preferably heat conductive material.

The jetting device 1 is provided with an ejection nozzle 4 through which a droplet of the fluid may be ejected. The nozzle or orifice 4 is a through hole extending through a wall of a fluid chamber body 6. In the fluid chamber body 6, a fluid chamber is arranged. The fluid chamber is configured to hold the fluid.

For ejecting droplets of molten metal, the jetting device 1 is provided with two permanent magnets 8a, 8b (hereinafter also referred to as magnets 8). The magnets 8 are arranged between two magnetic field concentrating elements 10a, 10b (hereinafter also referred to as concentrators 10) made of magnetic field guiding material such as iron. The jetting device 1 is further provided with two electrodes 12a, 12b (hereinafter also referred to as electrodes 12) both extending into the fluid chamber body 6 through a suitable through hole such that at least a tip of each of the electrodes 12 is in direct electrical contact with the molten metal present in the fluid chamber. The electrodes 12 are supported by suitable electrode supports 14 and are each operatively connectable to a suitable electrical current generator (not shown) such that a suitable electrical current may be generated through the electrodes 12 and the molten metal present between the tips of the electrodes 12.

Figure 2:
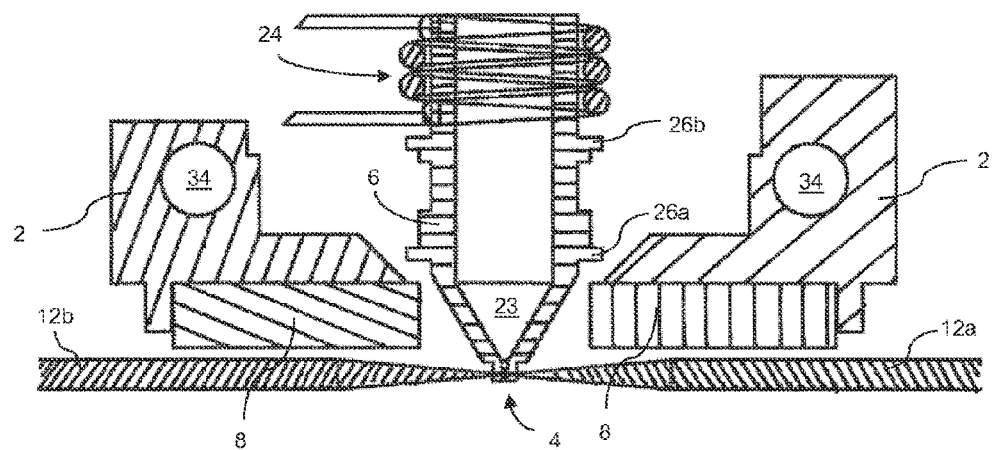
FIG. 2 is a cross-sectional view of a part of the printing device shown in FIG. 1.

FIG. 2 is a cross-section of the embodiment illustrated in FIG. 1, which cross-section is taken along line b-b (FIG. 1). Referring to FIG. 2, the support frame 2 and the magnets 8 are shown. In the illustrated embodiment, the support frame 2 is provided with cooling channels 34 through which a cooling liquid may flow for actively cooling of the support frame 2 and the magnets 8. An induction coil 24 is shown. The fluid chamber body 6 is arranged in a centre of the induction coil 24 such that a current flowing through the induction coil 24 results in heating of a metal arranged in the fluid chamber 6. Due to such heating, the metal may melt and thus become a fluid. Such inductive heating ensures a power-efficient heating and no contact between any heating element and the fluid, limiting a number of (possible) interactions between elements of the jetting device 1 and the fluid. Nevertheless, in other embodiments, other means for heating the metal in the fluid chamber may be applied.

Figure 3:
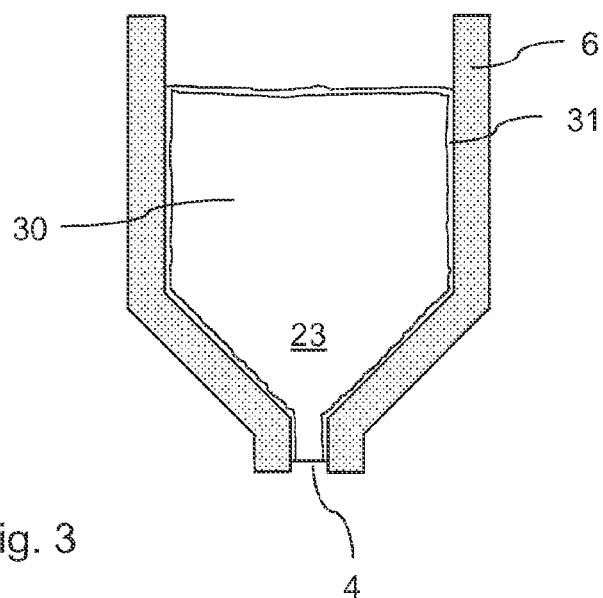
FIG. 3 is a schematic cross-sectional view of a part of a printing device in accordance with the present invention.

FIG. 3 is a schematic cross-sectional view of a part of a printing device in accordance with the present invention. In FIG. 3, the fluid chamber body 6 is shown. For clarity reasons, the support frame, the magnetic field concentrating elements, the magnets and the electrodes are not shown in FIG. 3.

The fluid chamber body 6 is preferably made of a heat resistant material, such as graphite. Graphite is an electrically conductive material and hence, the fluid present in the fluid chamber body may be heated using inductive heating. Alternatively, the fluid chamber body 6 may be made of a heat resistant, non-electrically conductive material.

The fluid chamber body 6 forms a fluid chamber 23, configured for holding an amount of electrically conductive fluid, preferably molten metal. The inner surface of the fluid chamber body may be modified by application of a coating (not shown). The coating may modify the properties of the inner surface of the fluid chamber and may, e.g. increase the wettability of the inner surface for the molten metal.

Droplets of the molten metal may be ejected from the fluid chamber 23 via the orifice 4.

The fluid chamber 23 schematically shown in FIG. 3 comprises an alloy. The alloy comprises a first molten metal and a second molten metal. In operation, in the fluid chamber 23, the second metal segregates from the alloy comprising the first metal. Hence, at the outer surface of the amount of molten metal present in the fluid chamber 23, a second phase 31 is present that is rich in the second metal. At the inside of the molten metal present in the fluid chamber 23, a first phase 30 is present that is poor in second metal and rich in the first metal. Hence, the properties of the metal alloy to be jetted are different close at the interface between the molten metal and the fluid chamber body 6, compared to the properties of the metal alloy further removed from the interface between the molten metal and the fluid chamber body 6. For example, the presence of the second phase 31 at the interface may prevent solid contaminants present in the alloy to precipitate in proximity of the orifice 4, and may thereby prevent the orifice 4 from becoming blocked.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually and appropriately detailed structure. In particular, features presented and described in separate dependent claims may be applied in combination and any combination of such claims are herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for ejecting droplets of a molten metal, the molten metal being positioned in a fluid chamber body, the fluid chamber body forming a fluid chamber for holding an amount of the molten metal, the fluid chamber body comprising an orifice, the orifice being in communication with the fluid chamber, the method comprising the steps of:
   providing a magnetic field to at least part of the molten metal positioned in the fluid chamber; and
   providing an electrical current in the part of the molten metal positioned in the magnetic field, thereby generating a Lorentz force in the molten metal,
   wherein the molten metal is a molten alloy comprising a first molten metal and a second molten metal, wherein the first molten metal and the second molten metal are such that in operation, the second molten metal segregates from the first molten metal,
   wherein the first molten metal is copper and the second molten metal is tin, and wherein the segregation of the second molten metal from the first molten metal forms a thin layer of the second molten metal along the inner surface of the fluid chamber, thereby preventing the contaminants from forming along the inner surface of the fluid chamber and blocking the orifice.

2. The method according to claim 1, wherein the surface tension of the second molten metal is lower than the surface tension of the first molten metal.

3. The method according to claim 1, wherein the temperature of the molten metal in the fluid chamber is at least 500° C.

4. The method according to claim 1, wherein the first molten metal is present in an amount of 70 wt % or higher based on the total amount of molten metal.

5. The method according to claim 1, wherein the second molten metal is present in an amount of 10 wt % or less, based on the total amount of molten metal.

6. A method for ejecting droplets of a molten metal, the molten metal being positioned in a fluid chamber body, the fluid chamber body forming a fluid chamber for holding an amount of the molten metal, the fluid chamber body comprising an orifice, the orifice being in communication with the fluid chamber, the method comprising the steps of:
   providing a magnetic field to at least part of the molten metal positioned in the fluid chamber; and
   providing an electrical current in the part of the molten metal positioned in the magnetic field, thereby generating a Lorentz force in the molten metal,
   wherein the molten metal is a molten alloy comprising a first molten metal and a second molten metal, wherein the first molten metal and the second molten metal are such that in operation, the second molten metal segregates from the first molten metal, wherein the first molten metal is copper,
   wherein the second molten metal is selected from at least one of the group consisting of tellurium, selenium, cadmium, indium and lead, and wherein the segregation of the second molten metal from the first molten metal forms a thin layer of the second molten metal along the inner surface of the fluid chamber, thereby preventing the contaminants from forming along the inner surface of the fluid chamber and blocking the orifice.

7. A method for ejecting droplets of a molten metal, the molten metal being positioned in a fluid chamber body, the fluid chamber body forming a fluid chamber for holding an amount of the molten metal, the fluid chamber body comprising an orifice, the orifice being in communication with the fluid chamber, the method prevents the orifice from being blocked by contaminants in the molten metal, the method comprising the steps of:
- providing a magnetic field to at least part of the molten metal positioned in the fluid chamber; and
- providing an electrical current in the part of the molten metal positioned in the magnetic field, thereby generating a Lorentz force in the molten metal,
- wherein the molten metal is a molten alloy comprising a first molten metal in a fluid state and a second molten metal in a fluid state, wherein the first molten metal and the second molten metal are such that in operation, the second molten metal in the fluid state segregates from the first molten metal in the fluid state,
- wherein the second molten metal prevents the contaminants in the molten alloy from precipitating and blocking the orifice,
- wherein the first molten metal is copper and the second molten metal is tin, and wherein the segregation of the second molten metal from the first molten metal forms a thin layer of the second molten metal along the inner surface of the fluid chamber, thereby preventing the contaminants from forming along the inner surface of the fluid chamber and blocking the orifice.

8. The method according to claim 7, wherein the temperature of the molten metal in the fluid chamber is at least 500° C.

9. The method according to claim 7, wherein the first molten metal is present in an amount of 70 wt % or higher based on the total amount of molten metal.

10. The method according to claim 7, wherein the second molten metal is present in an amount of 10 wt % or less, based on the total amount of molten metal.

* * * * *